United States Patent
Schulze et al.

(10) Patent No.: US 8,772,126 B2
(45) Date of Patent: Jul. 8, 2014

(54) METHOD OF MANUFACTURING A SEMICONDUCTOR DEVICE INCLUDING GRINDING FROM A BACK SURFACE AND SEMICONDUCTOR DEVICE

(75) Inventors: Hans-Joachim Schulze, Taufkirchen (DE); Anton Mauder, Kolbermoor (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/571,769

(22) Filed: Aug. 10, 2012

(65) Prior Publication Data

US 2014/0042595 A1 Feb. 13, 2014

(51) Int. Cl.
| H01L 21/8238 | (2006.01) |
| H01L 21/8234 | (2006.01) |
| H01L 21/762 | (2006.01) |
| H01L 21/683 | (2006.01) |
| H01L 41/338 | (2013.01) |

(52) U.S. Cl.
USPC .............. 438/421; 438/422; 438/33; 438/113; 438/460; 438/221; 438/424; 438/381; 438/296; 438/526; 438/475; 257/510; 257/E21.545; 257/E21.546; 257/E21.548; 257/E21.54; 257/E21.212; 257/E21.563

(58) Field of Classification Search
CPC ............... H01L 21/823481; H01L 21/823878; H01L 21/762; H01L 21/76229
USPC ............. 438/421–422, 221, 424, 33, 68, 113, 438/460, 433, 381, 222, 296, 526, 475, 248, 438/391; 257/622, E21.545, E21.546, 257/E21.548, 510, 513, E21.001, E21.54, 257/516, E29.325, E21.003, E21.212, 257/E21.563

See application file for complete search history.

(56) References Cited

U.S. PATENT DOCUMENTS

| 6,790,751 | B2 * | 9/2004 | Tsuruta et al. ................. 438/524 |
| 7,105,448 | B2 * | 9/2006 | Takayama et al. ............. 438/690 |
| 7,867,879 | B2 | 1/2011 | Weber et al. |
| 2004/0147093 | A1 * | 7/2004 | Marty et al. ................... 438/442 |
| 2005/0035405 | A1 | 2/2005 | Mauder et al. |
| 2005/0087833 | A1 * | 4/2005 | Schuegraf et al. ............. 257/506 |
| 2005/0176222 | A1 * | 8/2005 | Ogura ........................... 438/514 |
| 2006/0194410 | A1 * | 8/2006 | Sugaya ........................... 438/424 |
| 2007/0037341 | A1 * | 2/2007 | Rueger et al. .................. 438/222 |
| 2007/0284692 | A1 * | 12/2007 | Lee et al. ....................... 257/510 |
| 2008/0149969 | A1 * | 6/2008 | Suzuki et al. .................. 257/255 |
| 2008/0150074 | A1 * | 6/2008 | Mishra et al. .................. 257/506 |
| 2008/0251883 | A1 * | 10/2008 | Kitamura et al. .............. 257/513 |
| 2009/0127648 | A1 * | 5/2009 | Chen et al. ..................... 257/506 |
| 2010/0025825 | A1 * | 2/2010 | DeGraw et al. ................ 257/621 |
| 2010/0038744 | A1 * | 2/2010 | Li et al. ........................... 257/510 |

(Continued)

FOREIGN PATENT DOCUMENTS

FR 2909368 A1 * 6/2008

*Primary Examiner* — Jarrett Stark
*Assistant Examiner* — Bitew Dinke
(74) *Attorney, Agent, or Firm* — Murphy, Bilak & Homiller, PLLC

(57) ABSTRACT

A cavity is etched from a front surface into a semiconductor substrate. After providing an etch stop structure at the bottom of the cavity, the cavity is closed. From a back surface opposite to the front surface the semiconductor substrate is grinded at least up to an edge of the etch stop structure oriented to the back surface. Providing the etch stop structure at the bottom of an etched cavity allows for precisely adjusting a thickness of a semiconductor body of a semiconductor device.

13 Claims, 9 Drawing Sheets

(56) References Cited

U.S. PATENT DOCUMENTS

| | | | |
|---|---|---|---|
| 2011/0084356 A1* | 4/2011 | Saarnilehto et al. | 257/506 |
| 2011/0133186 A1* | 6/2011 | Barlocchi et al. | 257/48 |
| 2011/0204488 A1* | 8/2011 | Itou et al. | 257/622 |
| 2012/0208346 A1* | 8/2012 | Kadoshima et al. | 438/425 |
| 2012/0267753 A1* | 10/2012 | Yeh et al. | 257/516 |
| 2012/0315738 A1* | 12/2012 | Kobayashi | 438/424 |

* cited by examiner

METHOD OF MANUFACTURING A SEMICONDUCTOR DEVICE INCLUDING GRINDING FROM A BACK SURFACE AND SEMICONDUCTOR DEVICE

BACKGROUND

Each semiconductor device includes a semiconductor body with doped zones that define the functionality of the semiconductor device. For some semiconductor devices, typical device parameters are a function of the thickness of the semiconductor body between a front and a back surface. Thickness variations of the semiconductor body spread the distribution of such device parameters. It is desirable to reduce the thickness variations of semiconductor bodies of semiconductor devices.

SUMMARY

According to an embodiment a method of manufacturing a semiconductor device includes etching a cavity from a front surface into a semiconductor substrate. After providing an etch stop structure at the bottom of the cavity, the cavity is closed. From a back surface opposite to the front surface, the semiconductor substrate is grinded at least up to an edge of the etch stop structure oriented toward the back surface.

According to another embodiment a semiconductor device includes a semiconductor body and a trench structure extending from a front surface into the semiconductor body. The trench structure includes an etch stop layer lining an inner surface of the trench structure and surrounding a void within the trench structure.

According to another embodiment a semiconductor substrate includes a disc-shaped semiconductor corpus. A trench structure forms a grid extending from a front surface into the semiconductor corpus. The trench structure includes an etch stop layer that lines the inner surface of the trench structure and leaves a space within the trench structure.

According to a further embodiment, a semiconductor device includes a semiconductor body in which a plurality of electrically separated doped zones are formed along a front surface. Buried etch stop islands in the semiconductor body directly adjoin a back surface of the semiconductor body in a vertical projection of the doped zone perpendicular to the front surface. A void may directly adjoin the buried etch stop island between the buried etch stop island and the front surface.

According to another embodiment, a grid-like cavity is etched from a front surface into a semiconductor substrate. The cavity is closed and the semiconductor substrate is grinded from a back surface opposite to the front surface at least up to an edge of the etch stop structure oriented to the back surface. A semiconductor die is singularized (i.e., isolated or removed from) from the semiconductor substrate along a parting line cutting through the grid-like cavity.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the invention and are incorporated in and constitute a part of this specification. The drawings illustrate the embodiments of the present invention and together with the description serve to explain principles of the invention. Other embodiments of the invention and intended advantages will be readily appreciated as they become better understood by reference to the following detailed description.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements have been designated by corresponding references in the different drawings if not stated otherwise.

The terms "having", "containing", "including", "comprising" and the like are open and the terms indicate the presence of stated structures, elements or features but not preclude additional elements or features. The articles "a", "an" and "the" are intended to include the plural as well as the singular, unless the context clearly indicates otherwise.

The term "electrically connected" describes a permanent low-ohmic connection between electrically connected elements, for example a direct contact between the concerned elements or a low-ohmic connection via a metal and/or highly doped semiconductor.

Figure 1A:
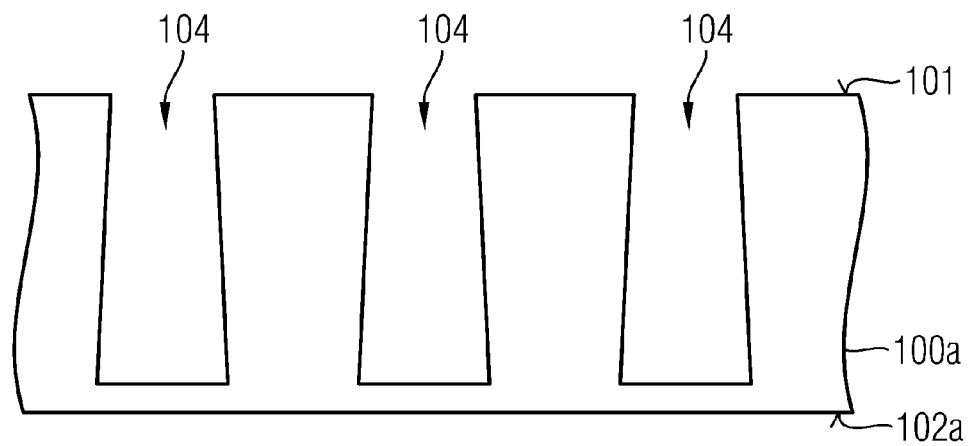
FIG. 1A is a schematic cross-sectional view of a semiconductor substrate in accordance with an embodiment of a method of manufacturing semiconductor devices related to an etch stop structure lining a cavity, after etching cavities.

FIG. 1A shows a semiconductor substrate 100a, e.g. a wafer, provided from a single crystalline semiconductor material, for example silicon Si, silicon carbide SiC, germanium Ge, a silicon germanium crystal SiGe, gallium nitride GaN or gallium arsenide GaAs. From a front surface 101, one or more cavities 104 are etched into the semiconductor substrate 100a. The etch process may be an RIE (reactive-ion etch), for example a DRIE (deep reactive-ion etch).

According to an embodiment, an etch mask layer is provided on the front surface 101 and patterned by photolithographic means, such that at least one opening exposes the front surface 101. Using the patterned etch mask layer as an etch mask, the semiconductor substrate 100a is isotropically etched to form a hollow below the opening in the etch mask. An etch resistive layer is provided on the inner surface of the hollow by polymerization, oxidation of the semiconductor material or by a conformal deposition method. According to an embodiment, a thin plasma polymer layer including chains based on, e.g. $CF_2$-groups, may be deposited that lines the inner surface of the hollow. The etch resistive layer is selectively opened at the bottom of the hollow by an anisotropic etch, for example by RIE or a plasma etch process. Remnants of the resistive layer cover the sidewalls of the hollow and are effective as an etch mask in subsequent etch processes. The process sequence includes isotropically etching the semiconductor substrate to form a hollow below an opening in an etch mask, providing an etch resistive layer on the inner surface of the hollow, and selectively opening the etch resistive layer by an anisotropic etch at the bottom. The process may be repeated several times to form the cavities 104 from a series of hollows provided one below each other. The width of the cavity 104 can be controlled by the process time and/or etch rate for the isotropic etch.

According to an embodiment, other processes to produce the cavities 104 may also be used, such as a continuous anisotropic etching process or a stepwise continuous anisotropic etching process.

The cavities 104 may have sidewalls which are approximately vertical to the front surface 101 and an initial back surface 102 opposite to the front surface 101. According to the illustrated embodiment, the cavities 104 widen with increasing distance from the front surface 101. The cavities 104 do not reach the initial back surface 102a. The cavities 104 may also be hole-shaped with approximately equal width and length. For example, the shape of the cavities 104 in a plane parallel to the front surface 101 may be a circle, an oval, an ellipse, or a rectangle with or without rounded corners. According to another embodiment, the cavities 104 are trenches with a length significantly exceeding the width, wherein the trenches may be straight or may have sharp bends, curves, and/or branches. Other embodiments may provide one or more circumferential cavities 104 for each semiconductor die obtained from the semiconductor substrate 100a.

Etch stop structures 111 are provided at the bottom of the cavities 104. According to an embodiment, an etch stop layer 110a (respectively a stop layer 110a) is provided that lines an inner surface including the bottom of the cavities 104 and that closes the cavities 104 in portions adjoining the front surface 101. Remnant portions of the etch stop layer 110a form the etch stop structures 111. Other embodiments may provide a selective deposition or growing of the etch stop structures 111 at the bottom of the cavities 104.

Figure 1B:
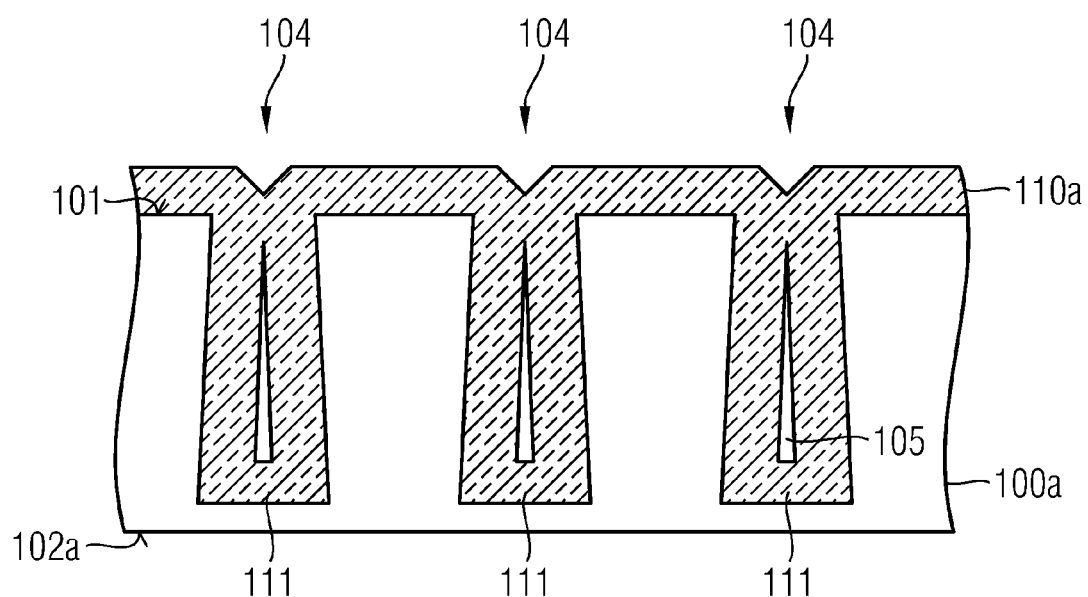
FIG. 1B is a cross-sectional view of the semiconductor substrate of FIG. 1A after providing an etch stop layer.

FIG. 1B shows the etch stop layer 110a lining the cavities 104 and covering the front surface 101 of the semiconductor substrate 100a. The etch stop layer 110a is provided from at least one etch stop material having a high etch selectivity against the semiconductor material. For example, the etch stop layer 110a may completely be provided from thermally grown semiconductor oxide or semiconductor nitride, e.g. silicon oxide or silicon nitride in the case of a single-crystalline silicon semiconductor substrate 100a. According to another embodiment, the etch stop layer 110a is a substantially conformally deposited layer. Other embodiments may provide the etch stop layer 110a as a layer stack including highly conformal layers, for example a grown silicon oxide, and less conformal, deposited layers, e.g. deposited silicon oxide, using, by way of example, TEOS (tetraethylorthosilane) as precursor material. The etch stop layer 110a may include sub-layers provided from silicon oxynitride or silicon nitride. The etch stop layer 110a may be provided from conformal and less conformal sub-layers such that the etch stop layer 110a fills the cavities 104 completely, e.g. with silicon oxide $SiO_2$. Further, the etch stop layer 110a may also show a high grinding selectivity against the semiconductor material.

According to the illustrated embodiment, the etch stop layer 110a leaves voids 105 in the cavities 104. Portions of the etch stop layer 110a at the bottom of the cavities 104 form the etch stop structures 111. Portions of the etch stop layer 110a outside the cavities 104 may be removed.

Figure 1C:
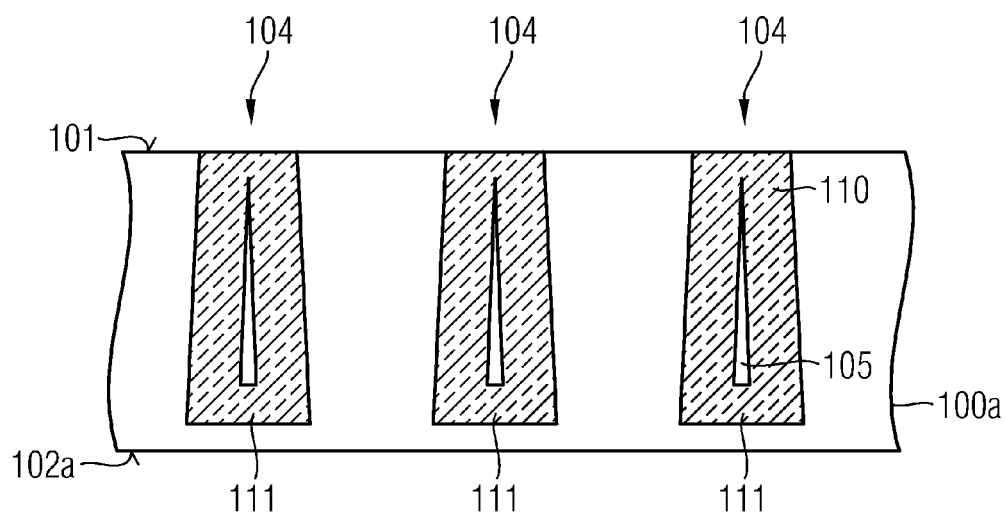
FIG. 1C is a schematic cross-sectional view of the semiconductor substrate of FIG. 1B after removing portions of the etch stop layer outside the cavities.

FIG. 1C shows the semiconductor substrate 100a after removing the portions of the etch stop layer 110a outside the cavities 104. According to an embodiment, the portions of the etch stop layer 110a outside the cavities are removed using a planar recess process, e.g. a polishing process like CMP (chemical-mechanical polishing) and/or dry etch processes with low selectivity as regards the density or type of the material to be removed. The planar recess process may open the voids 105. According to an embodiment, the planar recess process is controlled to leave the voids 105 closed. Remnant portions 110 of the etch stop layer 110a of FIG. 1B line the inner surface of the cavities 104 and surround the voids 105 within the cavities 104.

Notches that may develop between the remnant portions 110 and the semiconductor material at the front surface 101 may be planarized using a thin auxiliary layer from a resist material. The auxiliary layer is etched back in a dry etch process with low selectivity as regards the resist material and the remnant portions 110. A carrier 900 may be attached to or mounted on the front surface 101 and the semiconductor substrate 100a is thinned from the initial back surface 102a. The etch stop structure 111 is effective as an etch stop and/or grinding stop and may provide an etch stop signal and/or grinding stop signal indicating exposure of the etch stop structure 111.

A grinding process removes the semiconductor material from the initial back surface 102a up to an edge of the etch stop structures 111 oriented to the initial back surface 102a. The term grinding used herein covers any chipping with a geometrically undefined cutting edge. At the beginning of the process, grinding is performed using a grinding body, e.g. a grinding pad or grinding wheel, which has a rough surface, at a high downward force to achieve a high removal rate. Before the grinding is expected to reach the etch stop structures 111, the grinding body with the rough surface may be replaced with one having a smoother surface and/or the downward force may be reduced. For example, first the downward force is reduced and then the grinding body is exchanged. With the grinding body reaching the etch stop structures 111, the removal rate is significantly reduced, resulting in a significant increase of power or torque needed to drive the grinding body. When using an electrical motor to drive the grinding body, as it is assumed in the latter, the higher torque needed leads to a higher current in the motor driving the grinding body.

The etch stop structures 111, which may be island-like pads, stripes or frames, hamper a further removal of semiconductor material. The removal rate is significantly reduced, resulting in a significant increase of a motor current driving the grinding body. The drive current and/or the spectral response of the grinded back surface 102 may be monitored to stop the grinding. In case the semiconductor substrate 100a is tilted toward the grinding surface of the grinding body, the etch stop structures 111 hamper further removal of material in portions of the semiconductor substrate 100a where the grinding process first reaches the etch stop structures 111. As a result, the grinding process is self-adjusted and automatically compensates for a tilt angle between the initial back surface 102a and the grinding surface of the grinding body. After grinding, a small part of the semiconductor substrate 100a at the grinded back surface 102 may optionally be removed by one or a combination of wet-etching, dry-etching and polishing, e.g. CMP.

Since the depth of the cavities 104 can be adjusted very precisely, the thickness of the semiconductor body 100 of semiconductor devices resulting from the semiconductor substrate 100a can be adjusted with high precision and with high uniformity over the semiconductor substrate 100a. Thickness variations are significantly reduced, which spreads the distribution of device parameters that are a function of the thickness of the semiconductor body between a front and a back surface 101, 102. The carrier 900 may be a glass carrier. According to an embodiment, the carrier 900 is a reusable polished silicon disk. Since thinning is performed without wet etching and typically performed with spin etch apparatuses, the carrier 900 is not exposed to aggressive etching agents. For example, the carrier 900 is safe from spots which may reach the carrier 900 in spin etch apparatuses. Using CMP instead of a wet etch process allows for using a reusable polished silicon disk as the carrier 900, wherein the silicon disk can be provided with highly coplanar front and back surfaces 101, 102.

Figure 1D:
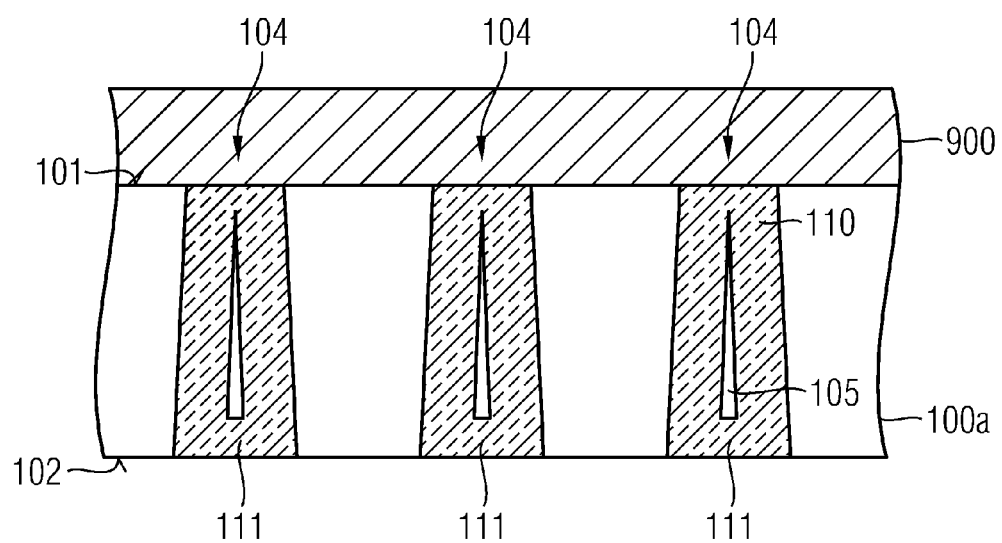
FIG. 1D is a cross-sectional view of the semiconductor substrate of FIG. 1C after thinning the semiconductor substrate from a back surface using a carrier.

FIG. 1D shows the carrier 900 mounted on the front surface 101 of the semiconductor substrate 100a. The grinded back surface 102 exposes the edges of the etch stop structures 111. The etch stop structures 111 may be removed in sections or completely. Further process steps that are effectively completed from the grinded back surface 102 may follow, including, for example, implants for generating backside emitters or field stop zones and deposition processes for providing a backside metallization.

Where conventional approaches for thinning a semiconductor substrate rely on a modification of the substrate material over the whole cross-section of the semiconductor substrate, (e.g., by growing a doped layer by epitaxy, resulting in high costs and high process complexity), the present embodiments provide distributed, isolated etch stop structures 111 with a comparatively low population density as regards the semiconductor substrate 100a.

The voids 105 compensate for local deformation and in this way reduce the mechanical stress in the semiconductor substrate 100a. Providing a sufficient number of trench-like cavities 104 in two orthogonal directions, for example along a direction notch/anti-notch and the direction perpendicular to the notch/anti-notch direction, compensates for mechanical stress caused by thick oxide structures deposited above the front surface 101 and the stress induced by the functional elements of the semiconductor devices obtained from the semiconductor substrate 100a.

Figure 2A:
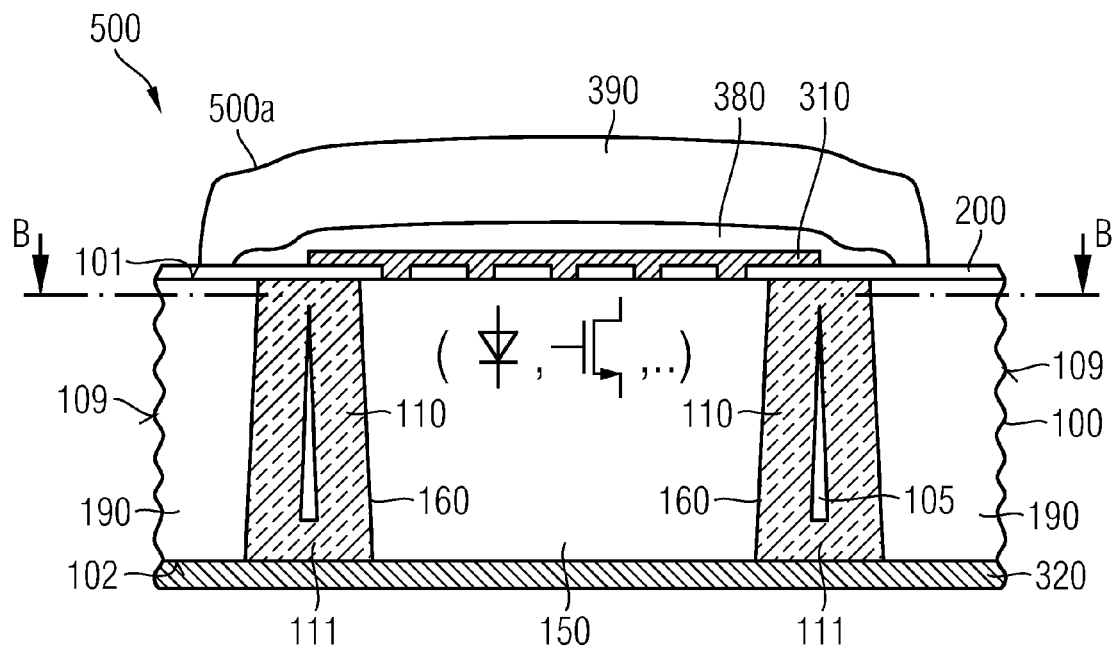
FIG. 2A is a schematic cross-sectional view of a semiconductor device according to an embodiment related to a circumferential trench structure.

FIG. 2A shows a semiconductor device 500 which may be obtained by the method illustrated in FIGS. 1A to 1D. A semiconductor body 100 with coplanar front and back surfaces 101, 102 is based on a single crystalline semiconductor material, for example silicon Si, silicon carbide SiC, germanium Ge, silicon germanium SiGe, gallium nitride GaN or gallium arsenide GaAs. One or more trench structures 160 extend from the front surface 101 through the semiconductor body 100 to the back surface 102. A backside metallization 320 may be provided on the back surface 102. A front side metallization 310 may be provided at a distance to the front surface 101.

A layered structure 200 may separate the front side metallization 310 from conductive structures formed within a mesa portion 150 of the semiconductor body 100. The layered structure 200 may encapsulate gate electrode structures provided at a distance to the front surface 101. According to other embodiments the gate electrode structures may be provided in gate trenches extending from the front surface 101 into the mesa portion 150. The layered structure 200 may further include gate dielectrics, wiring planes, electric connection structures and dielectric layers. For example, the layered structure 200 may include a main dielectric layer provided from BSG (boron silicate glass), PSG (phosphorus silicate glass) or BPSG (boron phosphorus silicate glass) and a thin silicon oxide layer deposited by using, for example, TEOS as precursor material between the main dielectric layer and the front surface 101.

A passivation layer 380 may cover the front side metallization 310. The passivation layer 380 may include a silicon oxide layer, a silicon nitride layer, or a silicon oxynitride layer provided by chemical vapor deposition. The thickness of the passivation layer 380 may be between 0.02 and 2.0 micrometer. A stress relief layer 390 may directly adjoin the passivation layer 380 and may extend beyond an outer edge of the passivation layer 380. The stress relief layer 390 may be a dielectric polymer and may contain or consist of polyimide, benzocyclobutene, polynorbornene, polystyrene, polycarbonate, parylene, or a mixture therefrom. Each of the passivation layer 380 and the stress relief layer 390 may extend up to the outer surface 109 of the semiconductor body 100 or may be formed at a distance from the outer surface 109.

In the mesa portion 150, semiconductor portions of semiconductor elements, like diodes or FETs (field effect transistors) are formed that define a functionality of the semiconductor device 500, which may be, for example, a semiconductor diode, an IGFET (insulated gate field effect transistor), for example a MOSFET (metal oxide semiconductor field effect transistor), which in the usual meaning includes FETs with metal and with non-metal gate electrodes, an IGBT (insulated gate bipolar transistor) or a thyristor. Each diode or FET may include a plurality of cells arranged in one or more cell arrays. According to an embodiment, the semiconductor device 500 may be a superjunction device.

Etch stop structures 111 are formed within the trench structures 160, which may be completely filled with remnant portions 110 of an etch stop layer in the rest. The material of the etch stop structures 111 shows high etch selectivity against the semiconductor material. For example, in the case of a semiconductor body 100 provided from a silicon crystal, the etch stop material may be or may contain silicon oxide, silicon oxynitride or silicon nitride. The material of the etch stop structures 111 may also show a high grinding selectivity against the semiconductor material.

A current path of the semiconductor device 500 is provided between the front side metallization 310 and the backside metallization 320 through the mesa portion 150 of the semiconductor body 100. Characteristic parameters of such so-called "vertical" semiconductor devices are a function of the distance between the front and back surfaces 101, 102. Since the trench structure(s) 160 allow(s) for a self-aligned adjustment of a grinding process from the back surface 102, the semiconductor device 500 shows low variations of characteristic device parameters. For example, in the reverse mode, a reverse blocking voltage of some thousand Volts can be accommodated over the thickness of the semiconductor body 100 between the front and back surfaces 101, 102. The lower a specified reverse breakdown voltage of the semiconductor device 500 is, the lower an admissible range for thickness variations.

Conventional methods of providing a thinning of the semiconductor body 100 from the back surface 102 result in thickness variations of the semiconductor body 100 due to deviations of the initial thickness of the semiconductor substrate, thickness variations of a carrier stabilizing a semiconductor substrate during thinning, thickness variations of a carrier system which might include an adhesive layer, and angular deviations between the initial substrate, the carrier and a polishing surface. Instead, the trench structure 160 of the semiconductor device 500 allows for adjusting the thickness of the semiconductor body 100 to the depth of the trench structures 160, which can be precisely tuned since deep silicon etch processes show depth variations of less than ±3% with regard to the depth of the etching.

According to an embodiment, the remnant portions 110 of the etch stop layer surround voids 105. The voids 105 compensate for deformations and hence reduce the mechanical stress in the semiconductor device 500. The voids 105 further compensate for mechanical stress occurring during processing of the semiconductor device 500 in a wafer composite. As a result, the semiconductor device 500 includes less defects, for example cracks, and shows a better long-term stability.

The trench structures 160 may have approximately equal widths and lengths. For example a cross-sectional shape of the trench structures 160 parallel to the front surface 101 may be a regular circle, an ellipsoid, an oval or a rectangle with or without rounded corners. According to another embodiment, at least some of the trench structures 160 are stripe shaped with a length significantly exceeding the width. The stripes may be straight, bowed, sharply bent and/or branched. A plurality of trench structures 160 may be distributed in the semiconductor body 100.

Figure 2B:
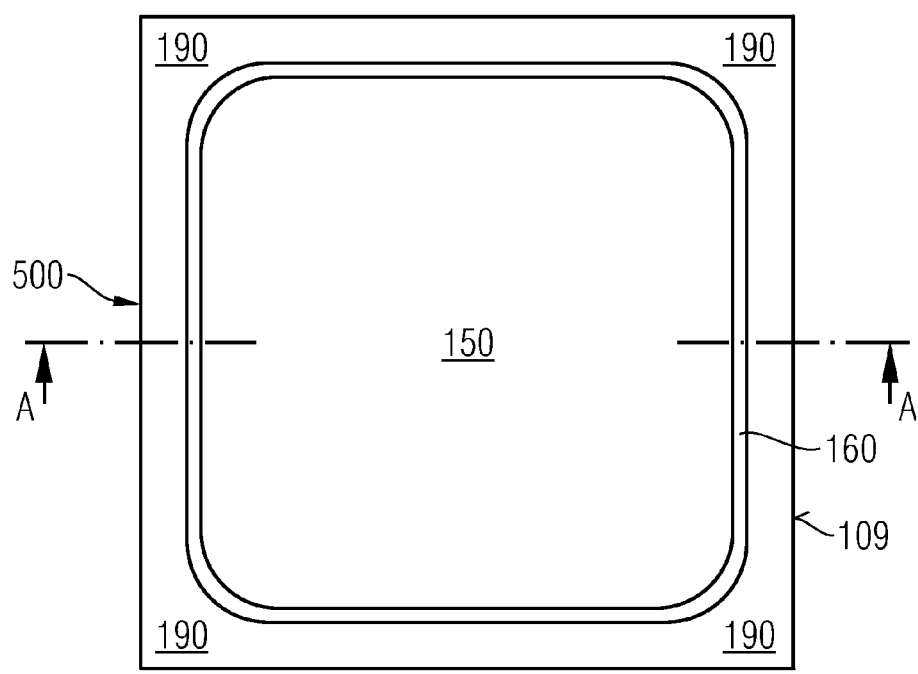
FIG. 2B is a schematic cross-sectional view of the semiconductor device of FIG. 2A along line B-B parallel to the front surface.

According to the embodiment illustrated in FIGS. 2A and 2B, the trench structure 160 is a circumferential trench structure. As illustrated in FIG. 2B, the trench structure 160 surrounds the mesa portion 150 of the semiconductor body 100 at a distance to the outer surface 109. The void 105 in the trench structure 160 stops the propagation of cracks generated at the outer surface 109, for example, when singularizing the semiconductor die 500a from a semiconductor substrate that forms a composite or a plurality of semiconductor dies 500a. The cracks propagate through the edge portion 190 surrounding the mesa portion 150. Furthermore, the trench structure 160 blocks a diffusion from impurity atoms, for example copper atoms, from the edge portion 190 into the mesa portion 150.

Figure 3A:
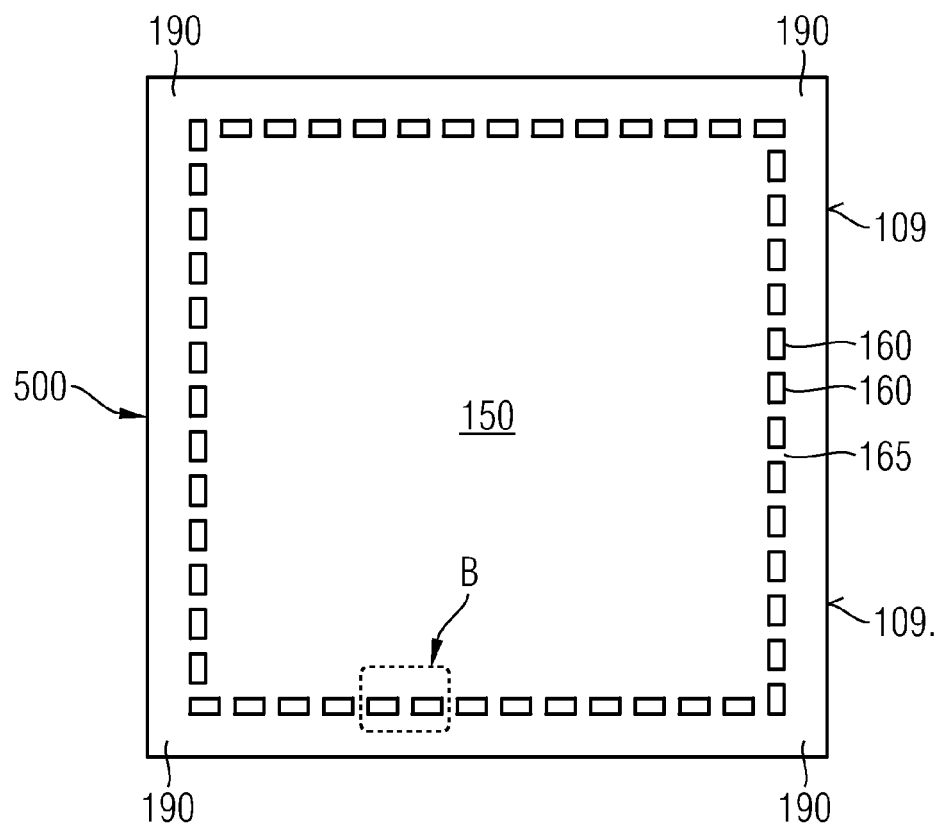
FIG. 3A is a schematic cross-sectional view of a semiconductor body of a semiconductor device in accordance with an embodiment providing a plurality of cavities arranged along a circumferential line and separated by fins.
Figure 3B:
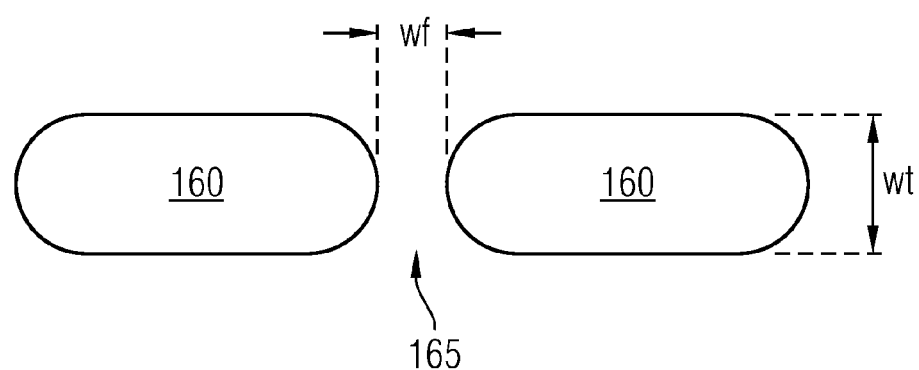
FIG. 3B shows a detail of FIG. 3A.

FIGS. 3A and 3B refer to an embodiment where a plurality of trench structures 160 separated by fins 165 are arranged along a circumferential line surrounding the mesa portion 150 and separating an edge portion 190 from the mesa portion 150. A width "wf" of the fins 165 between two directly neighboring trench structures 160 is selected such that an oxidation process for generating at least a portion of the etch stop material 110 completely consumes the semiconductor material between the two neighboring trench structures 160. According to an embodiment, the width wf of the fins 165 is less than 80% of the thickness of the thermally grown semiconductor oxide. For example, the width wf of the fins 165 is less than about 40% of a width "wt" of the trench structure 160 orthogonal to the circumferential line.

Figure 4A:
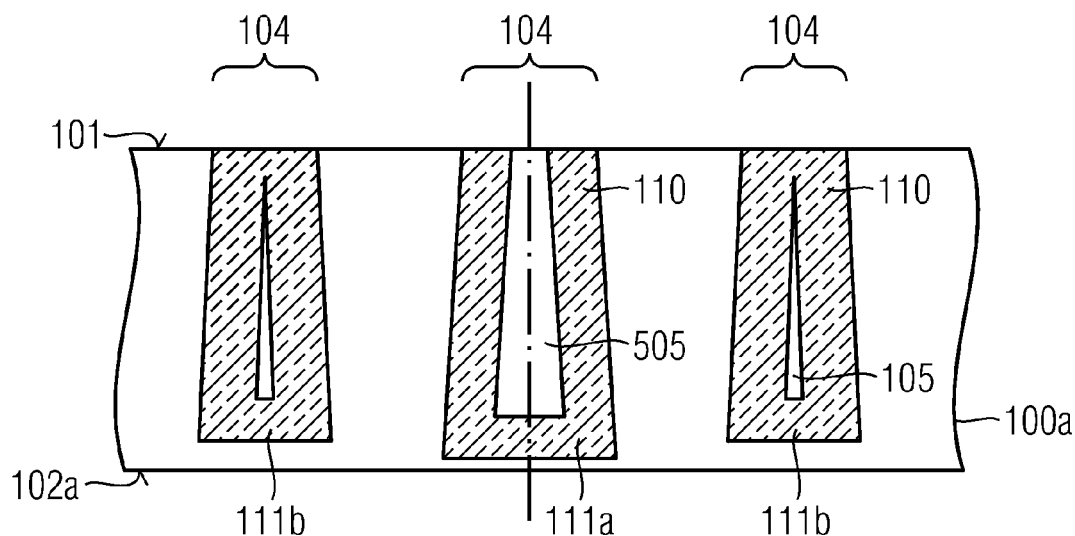
FIG. 4A is a schematic cross-sectional view of a semiconductor substrate in accordance with an embodiment related to a method of manufacturing a semiconductor device providing a grid-like trench structure after removing portions of an etch stop layer outside a grid-like cavity.
Figure 4B:
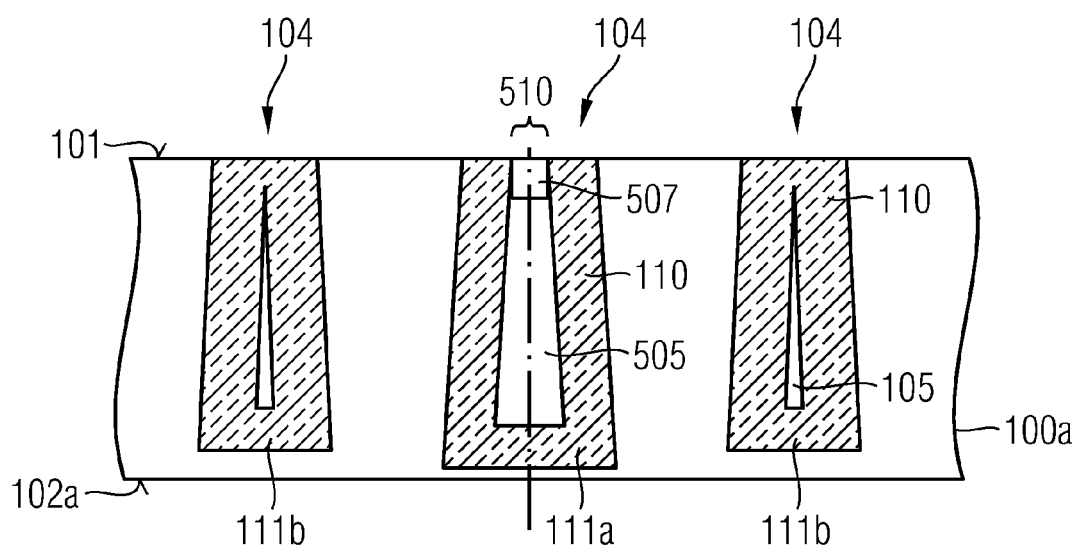
FIG. 4B is a cross-sectional view of the semiconductor substrate of FIG. 4A after closing the grid-like cavity.
Figure 4C:
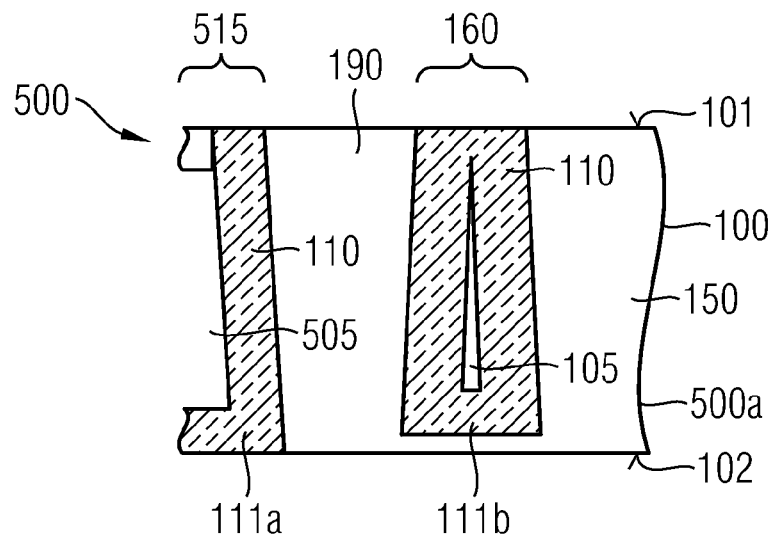
FIG. 4C is a schematic cross-sectional view of an edge portion of a semiconductor die obtained from the semiconductor substrate of FIG. 4B after singularizing by sawing.

FIGS. 4A to 4C refer to an embodiment with a cavity 104 forming a grid in a semiconductor substrate 100a. The grid-like cavity 104 may or may not be combined with other cavities 104, for example the circumferential cavities 104 as described above. FIGS. 4A to 4C refer to a grid-like cavity 104 in the middle, a first circumferential cavity 104 on the left hand side and a second circumferential cavity 104 on the right hand side of the grid-like cavity 104. After providing an etch stop layer that closes the circumferential cavities 104, excess portions of the etch stop layer outside the cavities 104 are removed.

As shown in FIG. 4A the circumferential cavities 104 are closed, wherein remnant portions 110 of the etch stop layer leave voids 105 in the circumferential cavities 104, line the grid-like cavity 104 in the middle of FIG. 4A, and leave a free space 505 in the grid-like cavity 104 which is open towards the front surface 101. At the bottom of the grid-like cavity 104, the remnant portions 110 form a first etch stop structure 111a. At the bottom of the circumferential cavities 104 the remnant portions 110 form second etch stop structures 111b. According to an embodiment providing a reactive ion etch process for etching the cavities 104, the grid-like cavity 104 in the middle of FIG. 4A is wider and deeper than the circumferential cavities 104. Accordingly, the first etch stop structure 111a is closer to the back surface 102 than the second etch stop structures 111b.

The grid-like cavity 104 may be left open until singularizing semiconductor dies from the semiconductor substrate 100a. According to another embodiment, a non-conformal deposition process may deposit an auxiliary material that does not fill the space 505 but forms a plug 507 closing the space 505. Excess material of the auxiliary layer outside the space 505 may be removed by an isotropic etch process.

FIG. 4B shows the plug 507 from the auxiliary material closing the space 505. The auxiliary material may be a material which shows high etch selectivity against the semiconductor material of the semiconductor substrate 100a. According to an embodiment, the auxiliary material forming the plug 507 is or contains silicon oxide. The grid-like cavity 104 includes a kerf portion 510 along a parting line along which semiconductor dies are singularized. The semiconductor substrate 100a is thinned from the initial back surface 102a.

According to an embodiment, the thinning stops at the first etch stop structure 111a. Since the grid-like cavity 104 includes the kerf portion 510 which is consumed by sawing, laser-cutting or etching, the width of the grid-like cavities 104 is comparatively large such that a grinding and/or polishing process exposes comparatively large areas of etch stop material. According to another embodiment, the grinding and/or polishing process is continued after reaching the first etch stop structure 111a until the grinding and/or polishing reaches the second etch stop structures 111b, wherein the grinding and/or polishing time may be extended by a predefined time period or until a further increase of the motor current or another spectral response is detected. The semiconductor substrate 100a is diced before grinding of the semiconductor substrate 100a is finished. The semiconductor substrate 100a is then sawn, cut, etched or laser-diced along the parting line. FIG. 4C shows a semiconductor die 500a of a semiconductor device 500 obtained by singularization from the semiconductor substrate 100a of FIG. 4B after thinning and singularizing. The semiconductor die 500a includes a circumferential trench structure 160 which extends from the front surface 101 into the semiconductor body 100. The trench structure 160 may reach the grinded and/or polished back surface 102 or may end at a distance to the polished back surface 102 as illustrated. Remnants of the grid-like trench structure 160 provide an edge insulator 515 extending along an edge of the semiconductor body 100 between the front and the back surfaces 101, 102. The edge insulator 515 surrounds the semiconductor body 100. The edge insulator 515 is effective as a diffusion barrier inhibiting the diffusion from copper included in the front side or backside metallization and distributed during the sawing process along the sawing edges. Copper may react with the material of the semiconductor body 100 to form copper silicide having a higher volume than the precursor material such that copper penetrating a silicon crack widens up and deepens existing cracks in silicon. In addition, the circumferential trench structures 160 block any propagation of cracks generated in the edge area 190 into the mesa portion 150. According to an embodiment, the area from which the semiconductor devices are isolated, or singularized, may be located between two or more trenches having the space 505 and the plug 507.

Figure 5A:
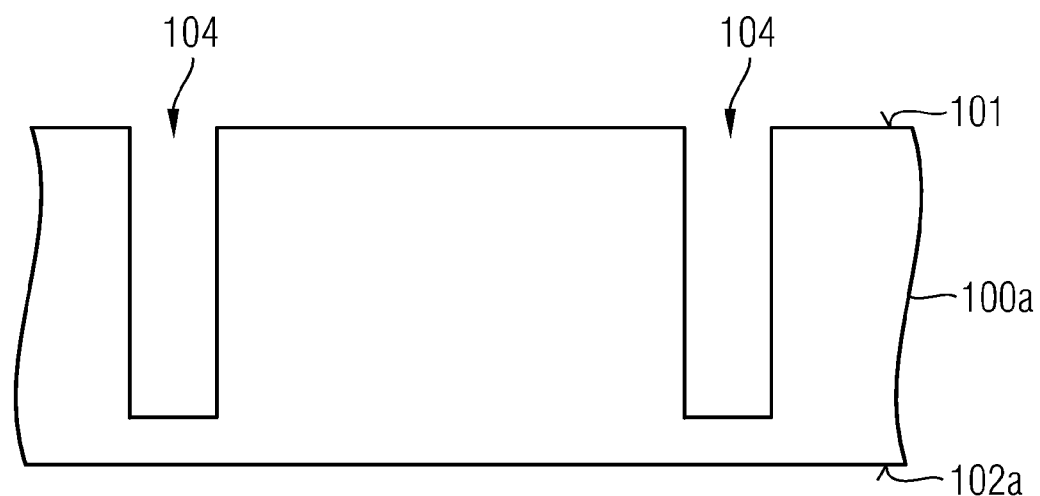
FIG. 5A is a schematic cross-sectional view of a semiconductor substrate for illustrating an embodiment of manufacturing a semiconductor device related to an etch stop structure provided at the bottom of cavities, after etching the cavities.
Figure 5B:
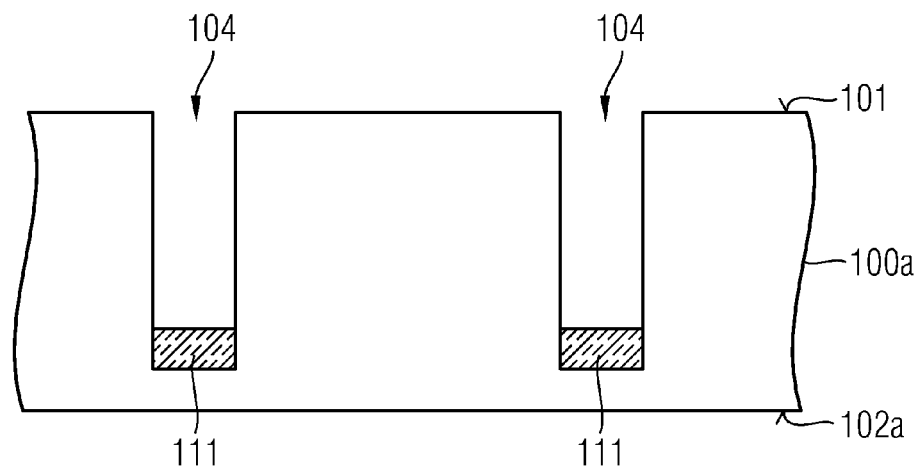
FIG. 5B is a schematic cross-sectional view of the semiconductor substrate of FIG. 5A after providing etch stop structures.

FIGS. 5A to 5D show the formation of buried etch stop islands. Cavities 104 are etched from a front side 101 into a semiconductor substrate 100a provided from a semiconductor material. FIG. 5A shows the cavities 104 protruding from the front surface 101 into the semiconductor substrate 100a in the direction of the opposing initial back surface 102a. The cavities 104 may be distributed over the semiconductor substrate 100a or concentrated along kerf and edge areas of semiconductor dies obtained from the semiconductor substrate 100a. The depth of the cavities 104 corresponds to the final thickness of the semiconductor dies. An etch stop structure 111 provided from one or more etch stop materials is formed at the bottom of each cavity 104. According to an embodiment, a high density plasma (HDP) process is used to provide the etch stop structures 111. The etch stop materials show a high etch selectivity against the semiconductor material of the semiconductor substrate 100a. The etch stop materials may also show a high grinding selectivity against the semiconductor material of the semiconductor substrate 100a. According to an embodiment, the etch stop materials are silicon oxide, silicon nitride and silicon oxynitride. FIG. 5B shows the etch stop structures 111 at the bottom of the cavities 104. The etch stop structures 111 do not fill the cavities 104 completely. Remnants of the etch stop material deposited along the sidewalls of the cavities 104 and/or native oxide may be removed, for example using a wet etch process. Then the semiconductor substrate 100a is annealed in a hydrogen containing ambient at high temperatures.

Figure 5C:
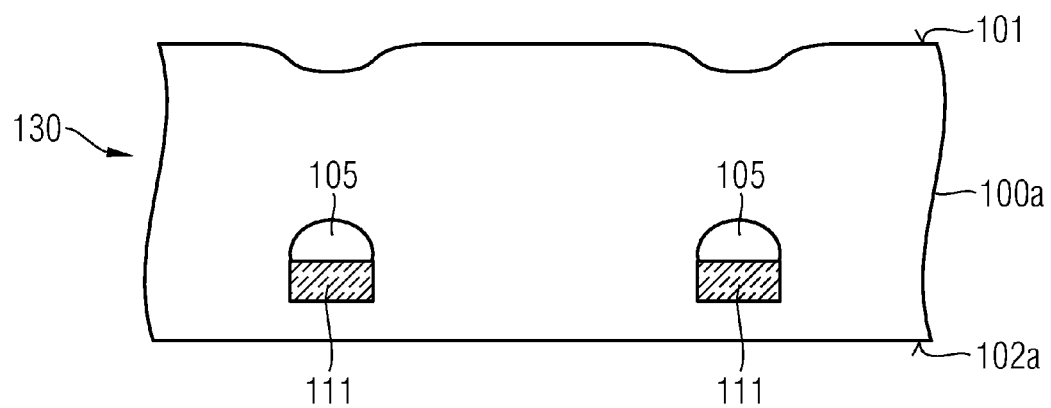
FIG. 5C is a schematic cross-sectional view of the semiconductor substrate of FIG. 5B after closing the cavities.
Figure 5D:
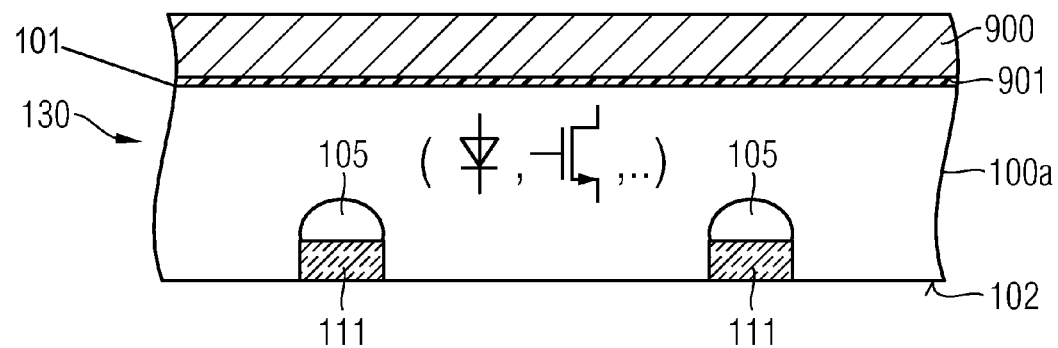
FIG. 5D is a schematic cross-sectional view of the semiconductor substrate of FIG. 5C after thinning from a back surface using a carrier.

FIG. 5C shows the semiconductor substrate 100a after tempering. Due to the high surface mobility of silicon atoms in a hydrogen containing atmosphere, the cavities 104 collapse and a contiguous layer 130 of the semiconductor material is formed above the etch stop structures 111. Voids 105 may be formed above the etch stop structures 111 forming etch stop islands. According to other embodiments, the contiguous layer 130 fills the cavity 104 completely such that no voids are formed above the etch stop structures 111. The front surface 101 may be planarized. A carrier 900 may be attached to the semiconductor substrate 100a on the front surface 101, for example by using an intermediate adhesion layer 901. The semiconductor substrate 100a is thinned from the back surface 102a, e.g. by grinding or grinding and polishing, and doped zones of circuit elements like diodes and transistors are formed in the contiguous layer 130 above the etch stop structures 111, which form buried etch stop islands 166. FIG. 5D shows the grinded back surface 102 exposing edges of the etch stop structures 111 oriented to the back surface 102 and the adhesion layer 901 fixing the semiconductor substrate 100a to the carrier 900. Electric elements are formed in the contiguous layer 130.

According to an embodiment, the semiconductor substrate 100a may be further thinned from a backside 102 such that the etch stop structures 111 are absent in the finalized semiconductor device. Other embodiments may provide keeping the etch stop structures 111 in the finalized semiconductor device. The process of FIG. 5A to 5D allows pre-processing of semiconductor substrates 100a for predefined blocking voltages without consuming chip area and simplifying process control as regards manufacturing variability and stocking.

Figure 6:
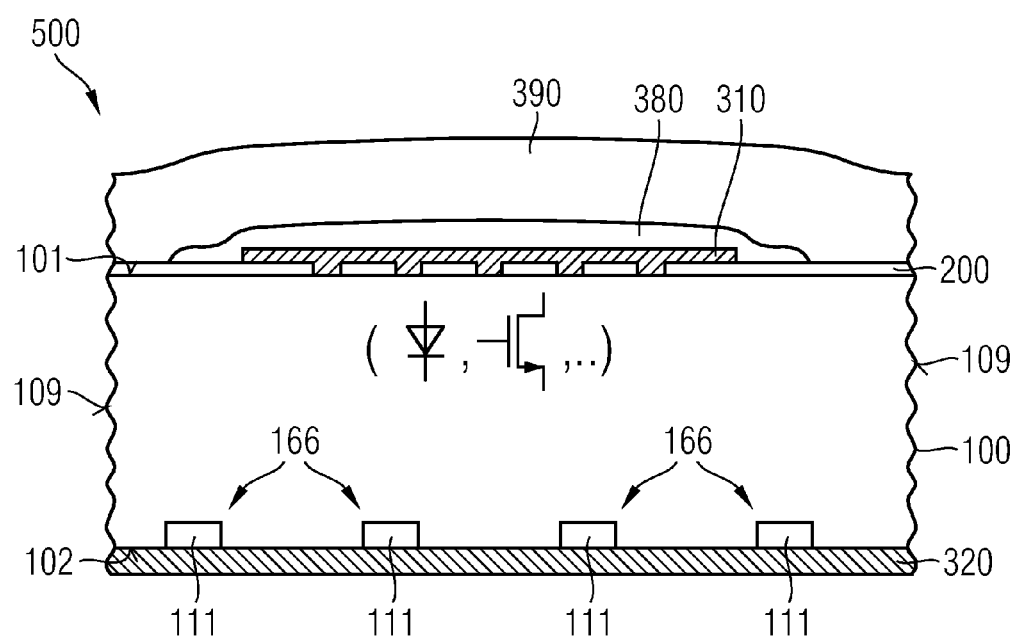
FIG. 6 is a schematic cross-sectional view of a semiconductor device in accordance with an embodiment providing buried etch stop islands.

FIG. 6 corresponds to FIG. 2A wherein the circumferential trench structures 160 are replaced with the buried etch stop islands 166. Another embodiment provides semiconductor devices 500 providing both the circumferential trench structure 160 of FIG. 2A and the buried etch stop islands 166 of FIG. 6.

Figure 7A:
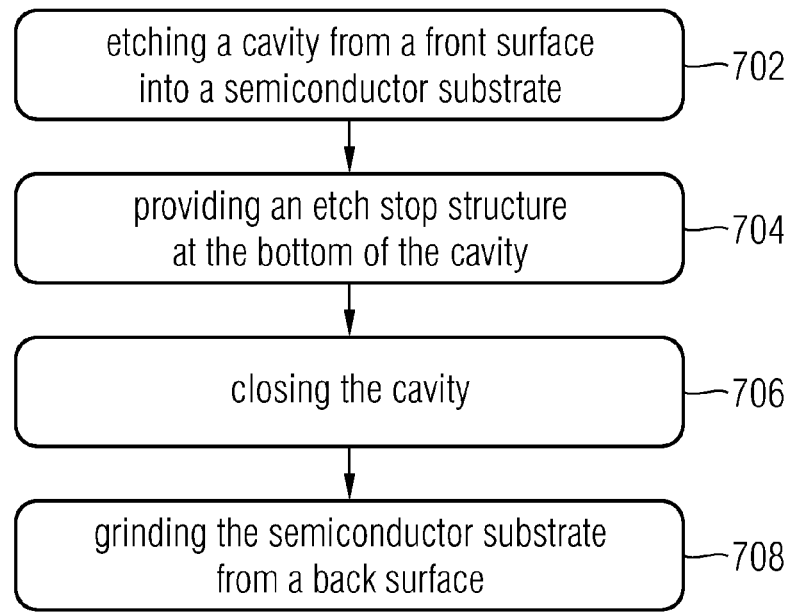
FIG. 7A is a simplified flow chart illustrating a method of manufacturing a semiconductor device in accordance with an embodiment related to trench structures with voids.

FIG. 7A refers to a method of manufacturing a semiconductor device. A cavity is etched from a front surface into a semiconductor substrate (702). An etch stop structure is provided at the bottom of the cavity (704) and the cavity is closed (706). The semiconductor substrate is grinded from a back surface opposite to the front surface at least up to an edge of the etch stop structure oriented to the back surface (708).

Figure 7B:
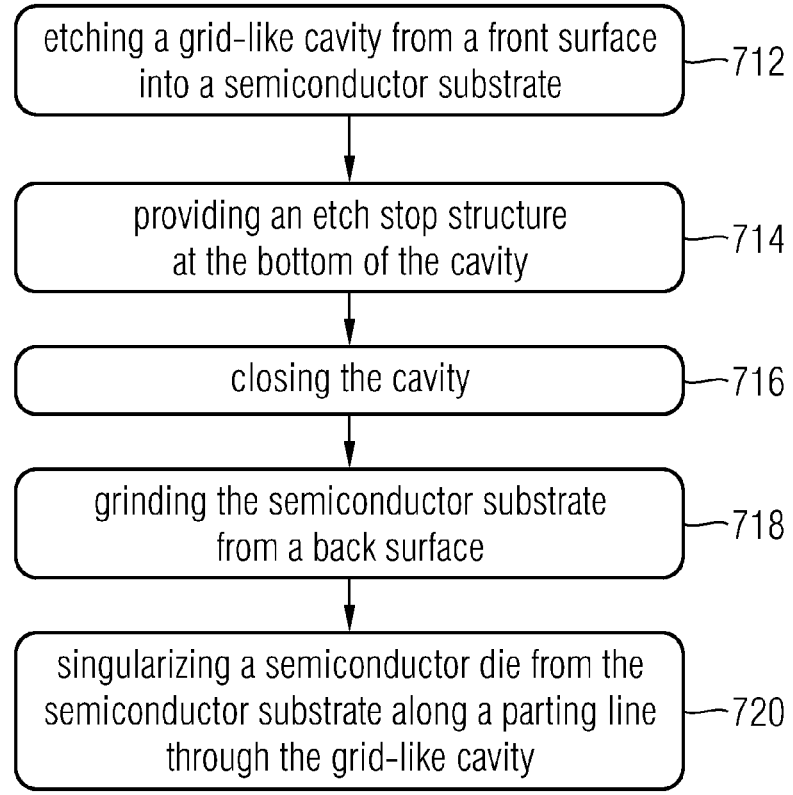
FIG. 7B is a simplified flow chart illustrating a method of manufacturing a semiconductor device in accordance with an embodiment related to a trench structure forming a grid in a semiconductor substrate.

FIG. 7B refers to a further method of manufacturing a semiconductor device. A cavity forming a grid is etched from a front surface into a semiconductor substrate (712). An etch stop structure is provided at the bottom of the cavity (704) and the cavity is at least partially closed (706). The semiconductor substrate is grinded from a back surface opposite to the front surface at least up to an edge of the etch stop structure oriented to the back surface (718). A semiconductor die is singularized from the semiconductor substrate along a parting line cutting through the etch stop structure (720).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method of manufacturing a semiconductor device, the method comprising
    etching a cavity from a front surface into a semiconductor substrate;
    providing an etch stop structure from at least one of silicon oxide, silicon nitride and silicon oxynitride at the bottom of the cavity;
    closing the cavity;
    grinding the semiconductor substrate from a back surface opposite to the front surface at least up to an edge of the etch stop structure oriented toward the back surface;
    monitoring, during grinding, a grind stop signal indicating exposure of the etch stop structure; and
    stopping or controlling the grinding in response to detection of the grind stop signal; wherein providing the etch stop structure comprises providing an etch resistive material at the
    bottom of the cavity, the etch resistive material being absent in a portion of the cavity above the etch stop structure; and
    wherein closing the cavity comprises tempering, after providing the etch stop structures, the semiconductor substrate in a hydrogen containing ambient to control a collapse of the cavity above the etch stop structure and to form a contiguous layer of a semiconductor material forming the semiconductor substrate above the collapsed cavity, the etch stop structure forming a buried etch stop island.

2. The method according to claim 1, wherein
    the cavity is closed in a portion adjoining the front surface.

3. The method according to claim 2, wherein
    a void is left in a portion of the cavity.

4. The method according to claim 1, wherein
    the cavity widens with increasing distance from the front surface.

5. The method according to claim 4, wherein
    providing the etch stop structure and closing the cavity comprise providing an etch stop layer lining an inner surface of the cavity, the etch stop layer closing the cavity at the front surface and leaving a void in the cavity.

6. The method according to claim 4, wherein
    the cavity forms a circumferential trench surrounding a mesa portion of the semiconductor device at a distance to an outer surface of a semiconductor body of the semiconductor device, and further comprising
    forming semiconductor elements in the mesa portion.

7. The method according to claim 4, wherein
    providing the etch stop layer comprises annealing a semiconductor material of the semiconductor substrate in an oxygen containing ambient to convert a portion of the semiconductor material into a semiconductor oxide forming at least a portion of the etch stop layer.

8. The method according to claim 7, wherein
    a plurality of the cavities is etched along a circumferential line surrounding a mesa portion of a semiconductor body of the semiconductor device at a distance to an outer surface of the semiconductor body, neighboring cavities being separated by fins of the semiconductor material, the fins being converted to semiconductor oxide during the tempering in the oxygen containing ambient.

9. The method according to claim 1, wherein
    the cavity forms a grid in the semiconductor substrate, and the method further comprises
    forming semiconductor elements in meshes of the grid; and
    singularizing a semiconductor die of the semiconductor device from the semiconductor substrate along a parting line through the cavity.

10. The method according to claim 1, further comprising planarizing the contiguous layer.

11. The method according to claim 1, further comprising
    forming a semiconductor element in the contiguous layer of the semiconductor material in a vertical direction above the buried etch stop island.

12. The method according to claim 1, further comprising removing the buried etch stop island.

13. A method of manufacturing a semiconductor device, the method comprising
    etching a cavity forming a grid from a front surface into a semiconductor substrate;
    providing an etch stop structure from at least one of silicon oxide, silicon nitride and silicon oxynitride at the bottom of the cavity;
    closing the cavity at least partially;
    grinding the semiconductor substrate from a back surface opposite to the front surface at least up to an edge of the etch stop structure oriented to the back surface;
    monitoring, during grinding, a grind stop signal indicating exposure of the etch stop structure;
    stopping or controlling the grinding in response to detection of the grind stop signal; and
    singularizing a semiconductor die from the semiconductor substrate along a parting line cutting through the etch stop structure;
    wherein providing the etch stop structure comprises providing an etch resistive material at the bottom of the cavity, the etch resistive material being absent in a portion of the cavity above the etch stop structure; and
    wherein closing the cavity comprises tempering, after providing the etch stop structures, the semiconductor substrate in a hydrogen containing ambient to control a collapse of the cavity above the etch stop structure and to form a contiguous layer of a semiconductor material forming the semiconductor substrate above the collapsed cavity, the etch stop structure forming a buried etch stop island.

* * * * *